United States Patent
Chou et al.

(10) Patent No.: US 9,929,198 B2
(45) Date of Patent: Mar. 27, 2018

(54) INFRARED IMAGE SENSOR

(71) Applicant: TAIWAN SEMICONDUCTOR MANUFACTURING CO., LTD., Hsinchu (TW)

(72) Inventors: Keng-Yu Chou, Kaohsiung (TW); Kazuaki Hashimoto, Zhubei (TW); Jen-Cheng Liu, Zhubei (TW); Jhy-Jyi Sze, Hsin-Chu (TW); Wei-Chieh Chiang, Yuanlin Township (TW); Pao-Tung Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 731 days.

(21) Appl. No.: 14/505,340

(22) Filed: Oct. 2, 2014

(65) Prior Publication Data
US 2016/0099271 A1    Apr. 7, 2016

(51) Int. Cl.
*H01L 27/146* (2006.01)
*H04N 5/225* (2006.01)
*H04N 5/33* (2006.01)

(52) U.S. Cl.
CPC .... *H01L 27/14621* (2013.01); *H01L 27/1462* (2013.01); *H01L 27/14627* (2013.01); *H01L 27/14649* (2013.01); *H01L 27/14685* (2013.01); *H04N 5/2257* (2013.01); *H04N 5/332* (2013.01)

(58) Field of Classification Search
CPC ........... H01L 27/14621; H01L 27/1462; H01L 27/14627; H01L 27/14649; H01L 27/14685; H04N 5/2257; H04N 5/332
See application file for complete search history.

(56) References Cited

U.S. PATENT DOCUMENTS 5,539,393 A * 7/1996 Barfod ................. G06Q 10/087
340/10.6
2008/0251873 A1* 10/2008 Kasano ............. H01L 27/14621
257/432

(Continued)

OTHER PUBLICATIONS

"Design Thin Film Narrow Band-pass Filters for Dense Wavelength Division Multiplexing," IJAAS, vol. 1, No. 2, Jun. 2012.*

*Primary Examiner* — Joseph Suh
(74) *Attorney, Agent, or Firm* — Maschoff Brennan (57) ABSTRACT

An image sensor includes a substrate, dual-waveband photosensitive devices, at least one infrared photosensitive device, a transparent dielectric layer, at least one infrared band-pass filter, a color filter layer and a micro-lens layer. The dual-waveband photosensitive devices are disposed in the substrate, and each dual-waveband photosensitive device is configured to sense an infrared light and one visible light. The infrared photosensitive device is disposed in the substrate, in which the dual-waveband photosensitive devices and the infrared photosensitive device are arranged in an array. The transparent dielectric layer is disposed over the dual-waveband photosensitive devices and the infrared photosensitive device. The infrared band-pass filter is disposed in the transparent dielectric layer and corresponds to the infrared photosensitive device. The color filter layer is disposed to cover the transparent dielectric layer and the infrared band-pass filter. The micro-lens layer is disposed on the color filter layer.

20 Claims, 6 Drawing Sheets

(56) References Cited

U.S. PATENT DOCUMENTS

| | | | |
|---|---|---|---|
| 2009/0135167 A1* | 5/2009 | Sakai | G02F 1/13318 345/207 |
| 2010/0003605 A1* | 1/2010 | Gil | G03F 7/70466 430/1 |
| 2012/0008023 A1* | 1/2012 | Wajs | H04N 1/409 348/273 |
| 2012/0025080 A1* | 2/2012 | Liu | H04N 5/332 250/332 |
| 2012/0056073 A1* | 3/2012 | Ahn | H01L 27/14609 250/208.1 |
| 2012/0132806 A1* | 5/2012 | Findlay | G01J 1/0266 250/338.1 |
| 2012/0243077 A1* | 9/2012 | Osawa | G02B 3/0056 359/356 |
| 2012/0326015 A1* | 12/2012 | Salsman | G02B 5/008 250/227.11 |
| 2013/0222603 A1* | 8/2013 | Agranov | H04N 5/332 348/164 |

* cited by examiner

INFRARED IMAGE SENSOR

BACKGROUND

Image sensors are usually operated to sense light. Typically, the image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These image sensors absorb light and convert the sensed light into digital data or electrical signals.

When a trend of electronic products including image sensors, such as mobile phone cameras, is developed toward more and more compact design, camera modules of the mobile phone cameras need to be scaled down. However, as the thickness of the mobile phones keeps shrinking down, it is more difficult to produce the camera modules with a desired thickness for the compact mobile phone camera.

Accordingly, while conventional image sensors may have been generally adequate for certain purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In photography, infrared radiation (IR) needs to be screened out from incident radiation. Typically, an image module, such as a camera module, includes an image sensor and a lens module disposed over the image sensor, in which the lens module includes an infrared filter element covering the image sensor to filter out the IR from the incident radiation before the incident radiation enters the image sensor. Thus, the image sensor can only receive visible radiation and reproduce a visual-like image. However, the infrared filter element includes a glass substrate and an infrared filter layer coating on the glass substrate, and the glass substrate is too thick to thin the camera module for an advanced electronic application, such as a mobile phone camera.

Embodiments of the present disclosure are directed to providing an image sensor, a method for manufacturing the image sensor and an image processing system, in which the image sensor includes various pixels, and at least one of the pixels includes an infrared band-pass filter and an infrared photosensitive device corresponding to the infrared band-pass filter. With the infrared band-pass filter and the corresponding infrared photosensitive device, a pure IR signal of incident radiation can be obtained. After the pure IR signal in each of incident radiation signals received by the other pixels is subtracted, each of the incident radiation signals without the IR signal can be obtained, so that a glass substrate of an infrared filter element of a typical image module can be eliminated, and the thickness of the image module can be significantly reduced. Moreover, because the glass substrate of the infrared filter element is eliminated, the amount of radiation entering the image sensor is increased. Accordingly, quantum efficiency of the image sensor is enhanced.

Figure 1:
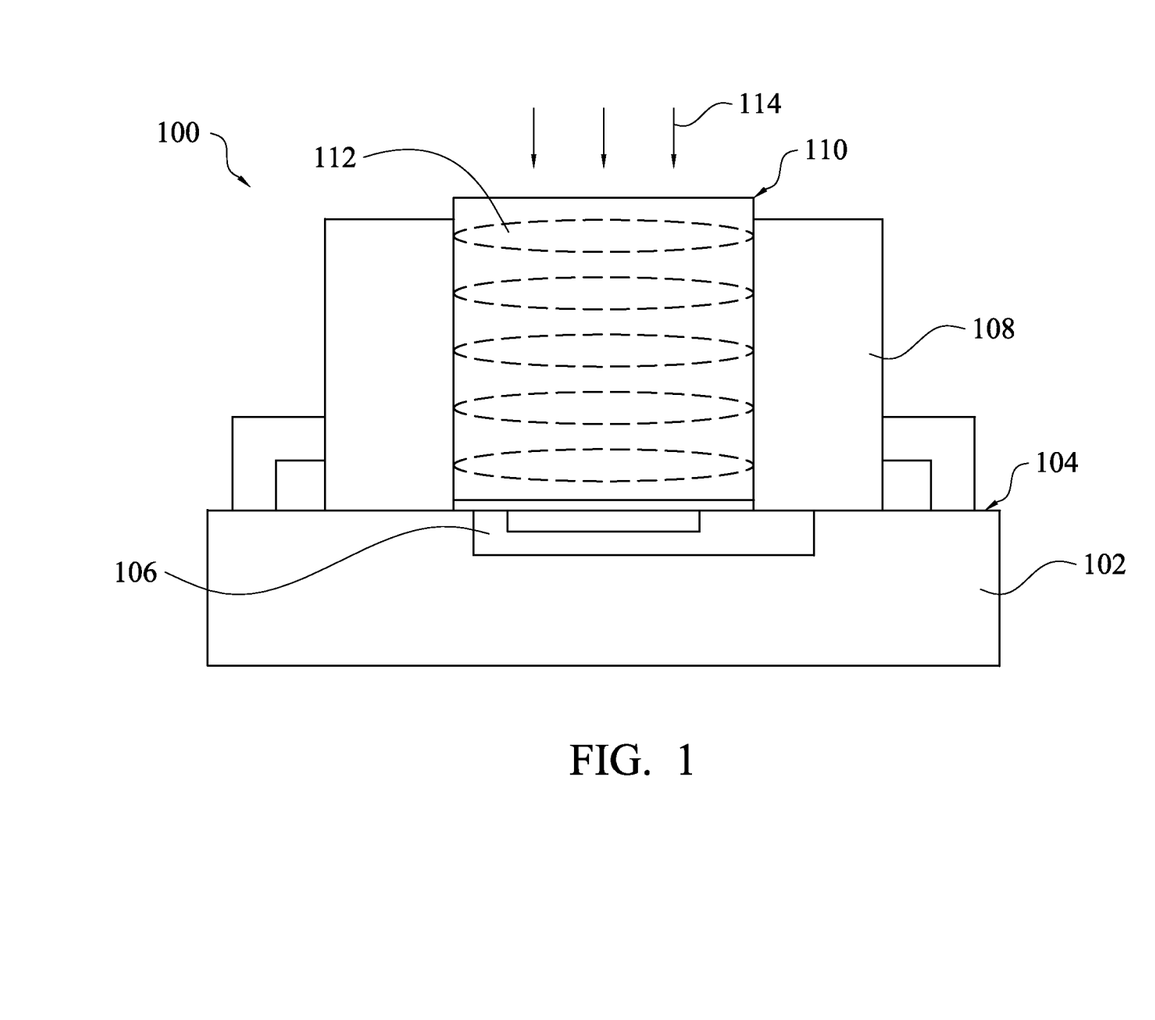
FIG. 1 is a schematic cross-sectional view of an image module in accordance with some embodiments.

FIG. 1 is a schematic cross-sectional view of an image module in accordance with some embodiments. In some embodiments, an image module 100 is a camera module, which may be operated for photographing. As shown in FIG. 1, the image module 100 includes a substrate 102, an image sensor 106, a holder 108 and a lens module 110. The substrate 102 may be a circuit board, such as a printed circuit board (PCB) and a flexible printed circuit board (FPCB), so as to include various circuits formed therein.

In some embodiments, the image sensor 106 is a CMOS image sensor device, which may be operated for sensing incident radiation 114. In certain examples, the image sensor 106 is a charge-coupled device (CCD) image sensor. The image sensor 106 is formed in a surface 104 of the substrate 102 and is electrically connected to the substrate 102. The image sensor 106 is formed with at least one pixel for obtaining a pure IR signal of the incident radiation 114, thereby removing the IR signal from incident radiation signals by subtracting the pure IR signal in signal post processing. Thus, the image module 100 can be fabricated without an additional infrared filter element disposed over the image sensor 106.

The lens module 110 includes various lenses 112 which are typically arranged in series to condense the incident radiation 114 for achieving a desired optical effect. The lens module 110 is held in a holder 108, and the holder 108 with the lens module 110 is mounted onto the surface 104 of the substrate 102 directly over the image sensor 106. Thus, after being condensed by the lenses 112 of the lens module 110, the incident radiation 114 including IR may enter and be received by the image sensor 106, in which IR within the incident radiation 114 is collected by at least one of the pixels of the image sensor 106. The image sensor 106 can convert optical signals of the incident radiation 114 including the IR into electrical signals each of which includes an IR signal component, and then the IR signal component can be subtracted from the electrical signals, so as to reproduce a visual-like image.

Figure 2A:
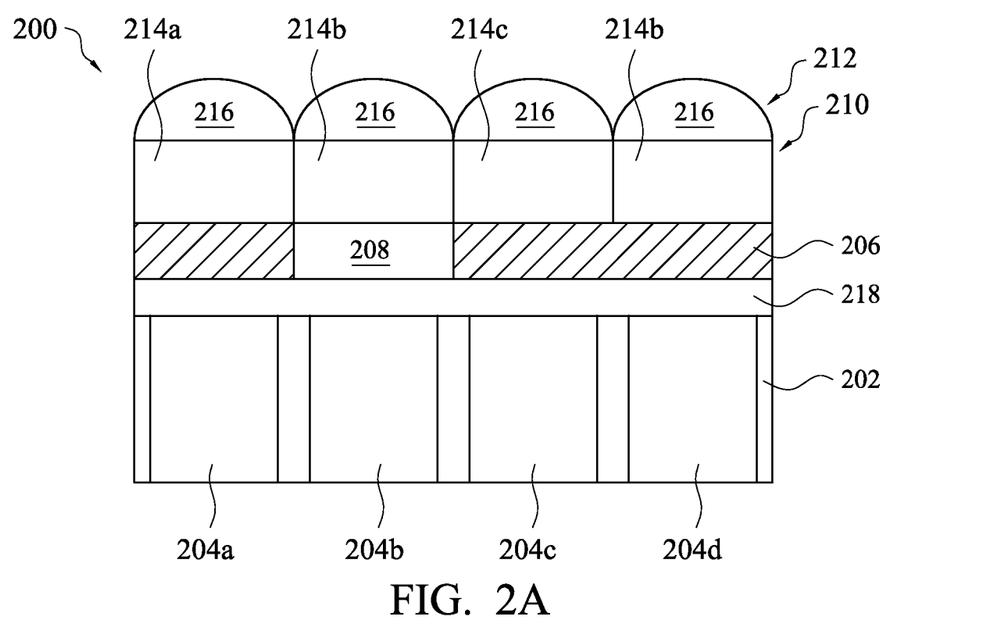
FIG. 2A is a schematic cross-sectional view of an image sensor in accordance with some embodiments.
Figure 2B:
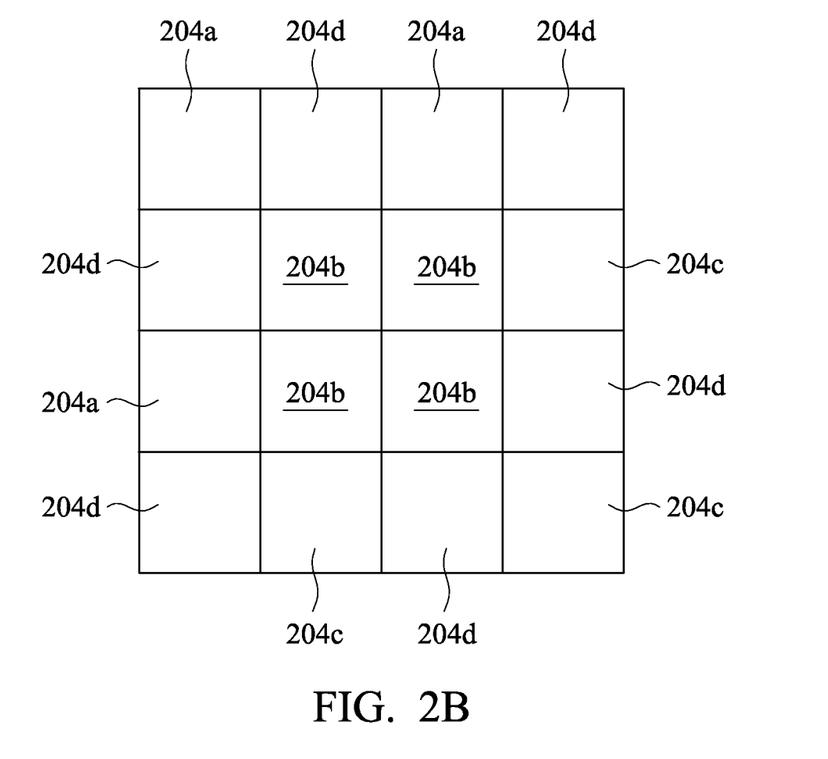
FIG. 2B is a schematic diagram showing an array of dual-waveband photosensitive devices and infrared photosensitive devices in an image sensor in accordance with some embodiments.
Figure 3A:
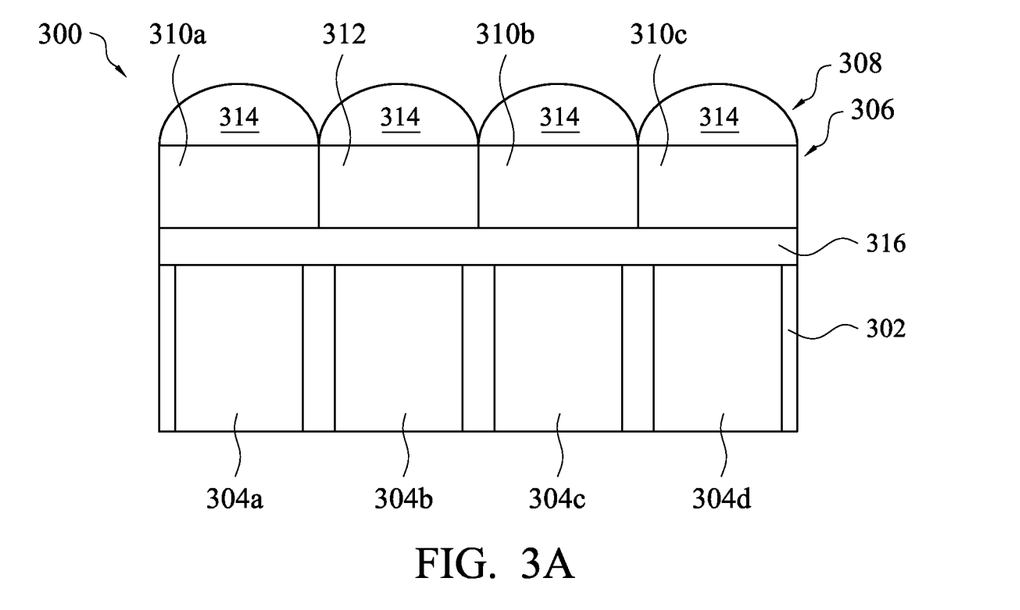
FIG. 3A is a schematic cross-sectional view of an image sensor in accordance with some embodiments.

In the image module 100, the image sensor 106 may include various types of image sensors, such as image sensors 200 and 300 respectively shown in FIG. 2A and FIG. 3A. These image sensors 200 and 300 are described in detail hereinafter. FIG. 2A is a schematic cross-sectional view of an image sensor in accordance with some embodiments, and FIG. 2B is a schematic diagram showing an array of dual-waveband photosensitive devices and infrared photosensitive devices in an image sensor in accordance with some embodiments. As shown in FIG. 2A, in some embodiments, an image sensor 200 includes a substrate 202, various dual-waveband photosensitive devices 204a, 204c and 204d, at least one infrared photosensitive device 204b, a transparent dielectric layer 206, at least one infrared band-pass filter 208, a color filter layer 210 and a micro-lens layer 212. The substrate 202 is a semiconductor substrate. The substrate 202 may be formed of a single-crystalline semiconductor material or a compound semiconductor material. For example, the substrate 202 is a silicon substrate. In some examples, carbon, germanium, gallium, arsenic, nitrogen, indium, phosphorus, and/or the like, may be included in the substrate 202.

The image sensor 200 may be composed of various pixels, and each pixel includes one of the dual-waveband photosensitive devices 204a, 204c and 204d, and the infrared photosensitive device 204b. The dual-waveband photosensitive devices 204a, 204c and 204d and the infrared photosensitive devices 204b can sense the radiation and convert optical signals of the radiation into electrical signals. As shown in FIG. 2A and FIG. 2B, the image sensor 200 may include various dual-waveband photosensitive devices 204a, various dual-waveband photosensitive devices 204c and various dual-waveband photosensitive devices 204d. In some examples, the image sensor 200 includes various infrared photosensitive devices 204b. The dual-waveband photosensitive devices 204a, 204c and 204d and the infrared photosensitive devices 204b are disposed in the substrate 202, and are arranged in an array, as shown in FIG. 2B. Each of the dual-waveband photosensitive devices 204a, 204c and 204d may be used to sense an infrared light and one type of visible light such as red light, blue light or green light. For example, the dual-waveband photosensitive devices 204a, 204c and 204d are respectively used to sense an infrared light and different types of visible light, such as red light, blue light and green light. In some exemplary examples, the dual-waveband photosensitive devices 204a, 204c and 204d include at least one red light and infrared light photosensitive device, at least one blue light and infrared light photosensitive device, and at least one green light and infrared light photosensitive device. In addition, the infrared photosensitive devices 204b are used to sense an infrared light. In some examples, the dual-waveband photosensitive devices 204a, 204c and 204d and the infrared photosensitive devices 204b are photodiodes.

Referring to FIG. 2A again, the transparent dielectric layer 206 is disposed over the substrate 202 and covers the dual-waveband photosensitive devices 204a, 204c and 204d and the infrared photosensitive devices 204b. In some exemplary examples, the transparent dielectric layer 206 is formed from silicon oxide. The infrared band-pass filter 208 is disposed in the transparent dielectric layer 206 and passes through the transparent dielectric layer 206. In addition, the infrared band-pass filter 208 is corresponding to the infrared photosensitive device 204b. In some examples, as shown in FIG. 2A and FIG. 2B, the image sensor 200 includes various infrared photosensitive devices 204b, so that the image sensor 200 also includes various infrared band-pass filters 208 respectively corresponding to the infrared photosensitive devices 204b. Each infrared band-pass filter 208 may include a titanium film with a thickness smaller than 1000 Angstroms. In certain examples, each infrared band-pass filter 208 includes a plasmonic structure, and the plasmonic structure may be formed from metals.

The color filter layer 210 is disposed over the transparent dielectric layer 206 and covers the transparent dielectric layer 206 and the infrared band-pass filter 208. As shown in FIG. 2A, the color filter layer 210 includes various color filter portions 214a, 214b and 214c, in which the color filter portions 214a and 214c are located respectively corresponding to the dual-waveband photosensitive devices 204a and 204c, one of the two color filter portions 214 are located corresponding to the dual-waveband photosensitive device 204d, and the other one of the two color filter portions 214 are located corresponding to the infrared photosensitive device 204b. In some examples, as shown in FIG. 2A and FIG. 2B, the image sensor 200 includes various dual-waveband photosensitive devices 204a, various dual-waveband photosensitive devices 204c, various dual-waveband photosensitive devices 204d and various infrared photosensitive devices 204b, so that the color filter layer 210 correspondingly includes various color filter portions 214a, various color filter portions 214b and various color filter portions 214c. Thus, the dual-waveband photosensitive devices 204a and 204c can respectively receive the radiations which have been filtered by the color filter portions 214a and 214c, and the dual-waveband photosensitive devices 204b and the infrared photosensitive devices 204b can respectively receive the radiations which have been filtered by the color filter portions 214b.

In some exemplary examples, the color filter portions 214a are red color filter portions, and the dual-waveband photosensitive devices 204a are red light and infrared light photosensitive devices for receiving the radiations filtered by the red color filter portions. The color filter portions 214c are blue color filter portions, and the dual-waveband photosensitive devices 204c are blue light and infrared light photosensitive devices for receiving the radiations filtered by the blue color filter portions. The color filter portions 214b are green color filter portions, the dual-waveband photosensitive devices 204b are green light and infrared light photosensitive devices for receiving the radiations filtered by some of the green color filter portions, and the infrared photosensitive devices 204b receive the radiations sequentially filtered by the others of the green color filter portions and the infrared band-pass filter 208.

The micro-lens layer 212 is disposed on the color filter layer 210. In some example, the micro-lens layer 212 includes various micro-lenses 216, and locations and areas of the micro-lenses 216 are respectively corresponding to those of the color filter portions 214a, 214b and 214c. The incident radiations are condensed by the micro-lenses 216, and then are converged on the color filter portions 214a, 214b and 214c correspondingly.

In various examples, as shown in FIG. 2A, the image sensor 200 optionally includes an anti-reflective coating (ARC) layer 218, in which the anti-reflective coating layer 218 is disposed between the substrate 202 and the transparent dielectric layer 206. Thus, the anti-reflective coating layer 218 is located between the substrate 202 and the infrared band-pass filter 208. With the anti-reflective coating layer 218, the amount of the radiation entering the dual-waveband photosensitive devices 204a, 204c and 204d and the infrared photosensitive devices 204b is increased.

Simultaneously referring to FIG. 1 through FIG. 2B, with at least one of the pixels of the image sensor 200 which is designed to include one infrared photosensitive device 204b and one infrared band-pass filter 208, a pure IR electrical signal can be obtained for reference. Next, a circuit design can be used to perform signal post processing on all the electrical signals (each of which includes an IR signal component) in all of the pixels of the image sensor 200, so as to subtract the IR signal component from the electrical signals, thus re-producing a visual-like image of the incident radiation. Therefore, an additional infrared filter element can be omitted, and a glass substrate holding the infrared filter element can be removed from the lens module 110 to reduce the thickness of the lens module 110, thereby effectively thinning the image module 100. Such that, the image module 100 can be implemented into a thin electronic device, such as a thin mobile phone.

Figure 3B:
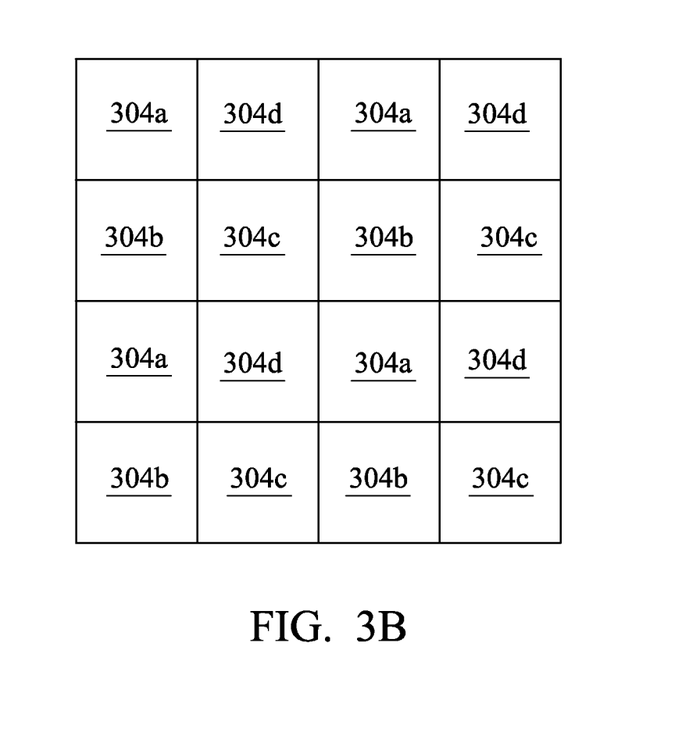
FIG. 3B is a schematic diagram showing an array of dual-waveband photosensitive devices and infrared photosensitive devices in an image sensor in accordance with some embodiments.

FIG. 3A is a schematic cross-sectional view of an image sensor in accordance with some embodiments, and FIG. 3B is a schematic diagram showing an array of dual-waveband photosensitive devices and infrared photosensitive devices of an image sensor in accordance with some embodiments. As shown in FIG. 3A, in some embodiments, an image sensor 300 includes a substrate 302, various dual-waveband photosensitive devices 304a, 304c and 304d, at least one infrared photosensitive device 304b, a color filter layer 306 and a micro-lens layer 308. The substrate 302 is a semiconductor substrate. The substrate 302 may be formed of a single-crystalline semiconductor material or a compound semiconductor material. For example, the substrate 302 is a silicon substrate. In some examples, carbon, germanium, gallium, arsenic, nitrogen, indium, phosphorus, and/or the like, may be included in the substrate 302.

The image sensor 300 may be composed of various pixels, and each pixel includes one of the dual-waveband photosensitive devices 304a, 304c and 304d, and the infrared photosensitive device 304b. The dual-waveband photosensitive devices 304a, 304c and 304d and the infrared photosensitive devices 304b can sense the radiation and convert optical signals of the radiation into electrical signals. As shown in FIG. 3A and FIG. 3B, the image sensor 300 may include various dual-waveband photosensitive devices 304a, various dual-waveband photosensitive devices 304c and various dual-waveband photosensitive devices 304d. In some examples, the image sensor 300 includes various infrared photosensitive devices 304b. The dual-waveband photosensitive devices 304a, 304c and 304d and the infrared photosensitive devices 304b are disposed in the substrate 302, and are arranged in an array, as shown in FIG. 3B. Each of the dual-waveband photosensitive devices 304a, 304c and 304d may be used to sense an infrared light and one type of visible light such as red light, blue light or green light. For example, the dual-waveband photosensitive devices 304a, 304c and 304d are respectively used to sense an infrared light and different types of visible light, such as red light, blue light and green light. In some exemplary examples, the dual-waveband photosensitive devices 304a, 304c and 304d include at least one red light and infrared light photosensitive device, at least one blue light and infrared light photosensitive device, and at least one green light and infrared light photosensitive device. The infrared photosensitive devices 304b are used to sense infrared light. In some examples, the dual-waveband photosensitive devices 304a, 304c and 304d and the infrared photosensitive devices 304b are photodiodes.

The color filter layer 306 is disposed over the substrate 302, and the dual-waveband photosensitive devices 304a, 304c and 304d and the infrared photosensitive devices 304b formed in the substrate 302. As shown in FIG. 3A, the color filter layer 306 includes various color filter portions 310a, 310b and 310c and at least one infrared band-pass filter 312, in which the color filter portions 310a, 310b and 310c are located respectively corresponding to the dual-waveband photosensitive devices 310a, 310c and 310d, and the infrared band-pass filter 312 is located corresponding to the infrared photosensitive device 304b. In some examples, as shown in FIG. 3A and FIG. 3B, the image sensor 300 includes various dual-waveband photosensitive devices 304a, various dual-waveband photosensitive devices 304c, various dual-waveband photosensitive devices 304d and various infrared photosensitive devices 304b, so that the color filter layer 306 correspondingly includes various color filter portions 310a, various color filter portions 310b, various color filter portions 310c and various infrared band-pass filters 312. Thus, the dual-waveband photosensitive devices 304a, 304c and 304d and the infrared photosensitive devices 304b can respectively receive the radiations which have been filtered by the color filter portions 310a, 310b and 310c and the infrared band-pass filters 312. In some examples, each infrared band-pass filter 312 includes a titanium film with a thickness smaller than 1000 Angstroms. In certain examples, each infrared band-pass filter 312 includes a plasmonic structure, and the plasmonic structure may be formed from metals.

In some exemplary examples, the color filter portions 310a are red color filter portions, and the dual-waveband photosensitive devices 304a are red light and infrared light photosensitive devices for receiving the radiations filtered by the red color filter portions. The color filter portions 310b are blue color filter portions, and the dual-waveband photosensitive devices 304c are blue light and infrared light photosensitive devices for receiving the radiations filtered by the blue color filter portions. The color filter portions 310c are green color filter portions, and the dual-waveband photosensitive devices 304d are green light and infrared light photosensitive devices for receiving the radiations filtered by the green color filter portions.

The micro-lens layer 308 is disposed on the color filter layer 306. In some example, the micro-lens layer 308 includes various micro-lenses 314, and locations and areas of the micro-lenses 314 are respectively corresponding to those of the color filter portions 310a, 310b and 310c and the infrared band-pass filters 312. The incident radiations are condensed by the micro-lenses 314, and then are converged on the color filter portions 310a, 310b and 310c and the infrared band-pass filters 312 correspondingly.

In various examples, as shown in FIG. 3A, the image sensor 300 optionally includes an anti-reflective coating layer 316, in which the anti-reflective coating layer 316 is disposed between the substrate 302 and color filter layer 306. With the anti-reflective coating layer 316, the amount of the radiation entering the dual-waveband photosensitive devices 304a, 304c and 304d and the infrared photosensitive devices 304b is increased.

Simultaneously referring to FIG. 1, FIG. 3A and FIG. 3B, with at least one of the pixels of the image sensor 300 which is designed to include one infrared photosensitive device 304b and one infrared band-pass filter 312, a pure IR electrical signal can be obtained for reference. Next, a circuit design can be used to perform signal post processing on all the electrical signals (each of which includes an IR signal component) in all of the pixels of the image sensor 300, so as to subtract the IR signal component from the electrical signals, thus re-producing a visual-like image of the incident radiation. Therefore, an additional infrared filter element is not needed, and a glass substrate holding the infrared filter element can be removed from the lens module 110 to reduce the thickness of the lens module 110, thereby effectively thinning the image module 100.

Figure 4:
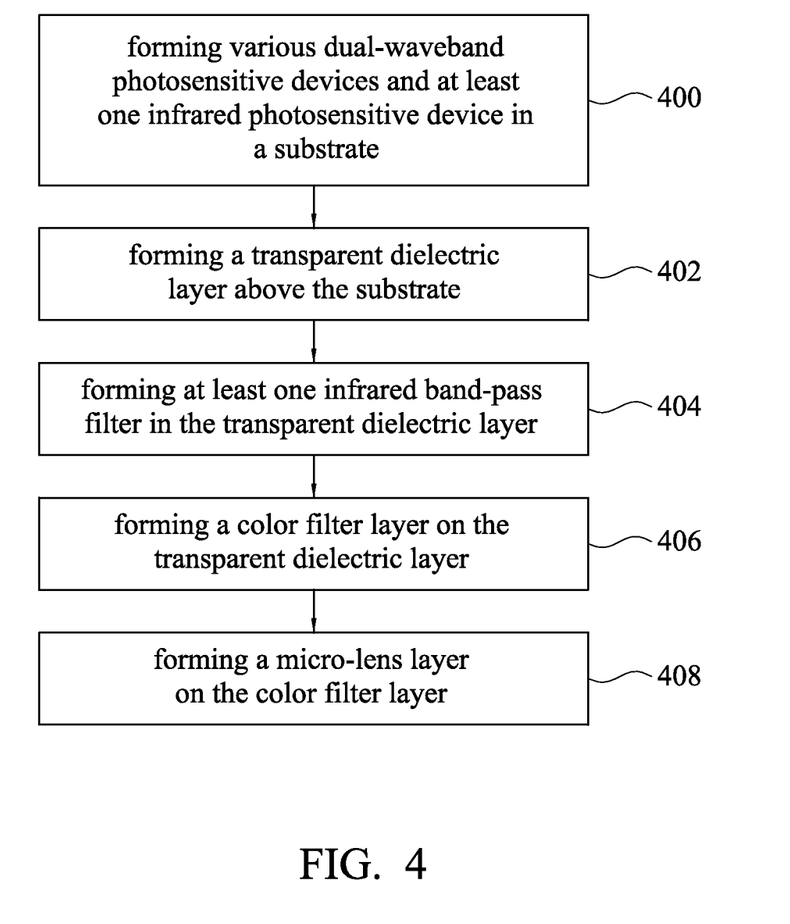
FIG. 4 is a flow chart of a method for manufacturing an image sensor in accordance with some embodiments.

Referring to FIG. 2A, FIG. 2B and FIG. 4, FIG. 4 is a flow chart of a method for manufacturing an image sensor in accordance with some embodiments. The method begins at operation 400, where various dual-waveband photosensitive devices 204a, 204c and 204d and at least one infrared photosensitive device 204b are formed in a substrate 202. The substrate 202 may be formed of a single-crystalline semiconductor material or a compound semiconductor material. For example, silicon, carbon, germanium, gallium, arsenic, nitrogen, indium, phosphorus, and/or the like, may be included in the substrate 202.

The dual-waveband photosensitive devices 204a, 204c and 204d and the infrared photosensitive devices 204b can sense the radiation and convert optical signals of the radiation into electrical signals. The dual-waveband photosensitive devices 204a, 204c and 204d and the infrared photosensitive devices 204b are arranged in an array, as shown in FIG. 2B. Each of the dual-waveband photosensitive devices 204a, 204c and 204d are formed to sense an infrared light and one type of visible light such as red light, blue light or green light, and the infrared photosensitive devices 204b are formed to sense infrared light. In some exemplary examples, the operation of forming the dual-waveband photosensitive devices 204a, 204c and 204d is performed to form the dual-waveband photosensitive devices 204a, 204c and 204d including at least one red light and infrared light photosensitive device, at least one blue light and infrared light photosensitive device, and at least one green light and infrared light photosensitive device. In some examples, the dual-waveband photosensitive devices 204a, 204c and 204d and the infrared photosensitive devices 204b are photodiodes.

At operation 402, a transparent dielectric layer 206 is formed over the substrate 202 to cover the dual-waveband photosensitive devices 204a, 204c and 204d and the infrared photosensitive devices 204b using a deposition process, for example. In some exemplary examples the transparent dielectric layer 206 is formed from silicon oxide. At operation 404, after the transparent dielectric layer 206 is formed, at least one infrared band-pass filter 208 is formed in the transparent dielectric layer 206 by using a photolithography technique and an etching technique to form at least one hole in the transparent dielectric layer 206 and using a deposition technique to deposit the infrared band-pass filter 208 in the hole of the transparent dielectric layer 206, for example. The infrared band-pass filter 208 is formed to correspond to the infrared photosensitive device 204b. In some examples, the operation of forming the infrared band-pass filter 208 is performed to form the infrared band-pass filter 208 including a titanium film with a thickness smaller than 1000 Angstroms. In certain examples, the operation of forming the infrared band-pass filter 208 is performed to form the infrared band-pass filter 208 including a plasmonic structure, in which the plasmonic structure may be formed from metals.

At operation 406, a color filter layer 210 is formed above the transparent dielectric layer 206 and the infrared band-pass filter 208 over the substrate 202 using a coating process, for example. In some examples, as shown in FIG. 2A and FIG. 2B, the operation of forming the color filter layer 210 is performed to form the color filter layer 210 including various color filter portions 214a, various color filter portions 214b and various color filter portions 214c, in which the color filter portions 214a and 214c are located respectively corresponding to the dual-waveband photosensitive devices 204a and 204c, some of the color filter portions 214 are located corresponding to the dual-waveband photosensitive devices 204d, and the others of the color filter portions 214 are located corresponding to those of the infrared photosensitive devices 204b.

In some exemplary examples, the operation of forming the color filter layer 210 includes forming the color filter portions 214a as red color filter portions, and the operation of forming the dual-waveband photosensitive devices 204a is performed to form the dual-waveband photosensitive devices 204a as red light and infrared light photosensitive devices for receiving the radiations filtered by the red color filter portions. The operation of forming the color filter layer 210 includes forming the color filter portions 214c as blue color filter portions, and the operation of forming the dual-waveband photosensitive devices 204c is performed to form the dual-waveband photosensitive devices 204c as blue light and infrared light photosensitive devices for receiving the radiations filtered by the blue color filter portions. The operation of forming the color filter layer 210 includes forming the color filter portions 214b as at least two green color filter portions, and the operation of forming the dual-waveband photosensitive devices 204d is performed to form the dual-waveband photosensitive devices 204d as green light and infrared light photosensitive devices for receiving the radiations filtered by some of the green color filter portions. The infrared photosensitive devices 204b receive the radiations sequentially filtered by the others of the green color filter portions and the infrared band-pass filter 208.

At operation 408, a micro-lens layer 212 is formed on the color filter layer 210. In some examples, the operation of forming the micro-lens layer 212 is performed to form the micro-lens layer 212 including various micro-lenses 216, in which locations and areas of the micro-lenses 216 are respectively corresponding to those of the color filter portions 214a, 214b and 214c.

In various examples, as shown in FIG. 2A, before the operation of forming the transparent dielectric layer 206 and the operation of forming the infrared band-pass filters 208, an anti-reflective coating layer 218 is optionally formed on the substrate 202 to cover the dual-waveband photosensitive devices 204a, 204c and 204d and the infrared photosensitive devices 204b. Accordingly, the operation of forming the transparent dielectric layer 206 and the operation of forming the infrared band-pass filter 208 are performed to respectively form the transparent dielectric layer 206 and the infrared band-pass filter 208 over the anti-reflective coating layer 218. With the formation of the anti-reflective coating layer 218, the amount of the radiation entering the dual-waveband photosensitive devices 204a, 204c and 204d and the infrared photosensitive devices 204b is increased.

Figure 5:
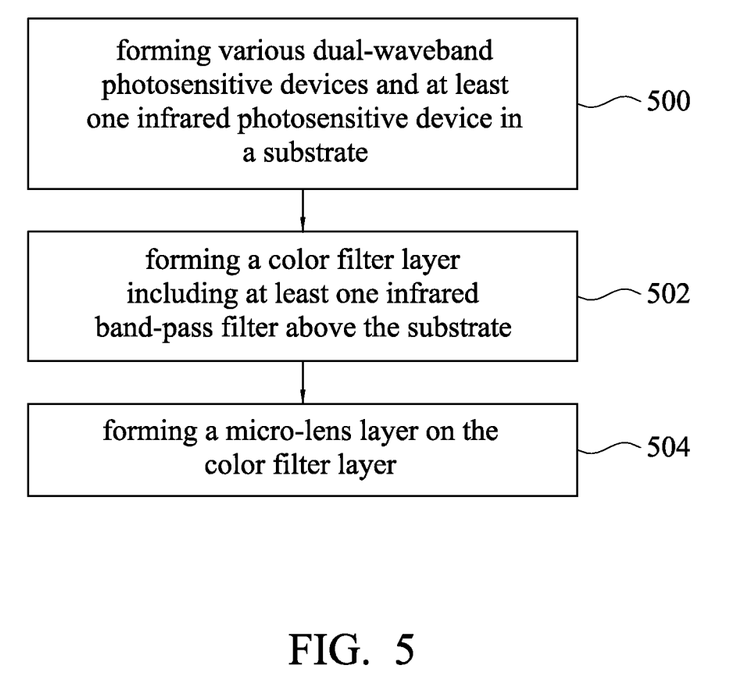
FIG. 5 is a flow chart of a method for manufacturing an image sensor in accordance with some embodiments.

Referring to FIG. 3A, FIG. 3B and FIG. 5, FIG. 5 is a flow chart of a method for manufacturing an image sensor in accordance with some embodiments. The method begins at operation 500, where various dual-waveband photosensitive devices 304a, 304c and 304d and at least one infrared photosensitive device 304b are formed in a substrate 302. The substrate 302 may be formed of a single-crystalline semiconductor material or a compound semiconductor material. For example, silicon, carbon, germanium, gallium, arsenic, nitrogen, indium, phosphorus, and/or the like, may be included in the substrate 302.

The dual-waveband photosensitive devices 304a, 304c and 304d and the infrared photosensitive devices 304b can sense the radiation and convert optical signals of the radiation into electrical signals. The dual-waveband photosensitive devices 304a, 304c and 304d and the infrared photosensitive devices 304b are arranged in an array, as shown in FIG. 3B. Each of the dual-waveband photosensitive devices 304a, 304c and 304d are formed to sense an infrared light and one type of visible light such as red light, blue light or green light, and the infrared photosensitive devices 304b are formed to sense infrared light. In some exemplary examples, the operation of forming the dual-waveband photosensitive devices 304a, 304c and 304d is performed to form the dual-waveband photosensitive devices 304a, 304c and 304d including at least one red light and infrared light photosensitive device, at least one blue light and infrared light photosensitive device, and at least one green light and infrared light photosensitive device. In some examples, the dual-waveband photosensitive devices 304a, 304c and 304d and the infrared photosensitive devices 304b are photodiodes.

At operation 502, a color filter layer 306 is formed above the substrate 302, the dual-waveband photosensitive devices 304a, 304c and 304d and the infrared photosensitive devices 304b using a coating process, for example. In some examples, as shown in FIG. 3A and FIG. 3B, the operation of forming the color filter layer 306 is performed to form the color filter layer 306 including various color filter portions 310a, various color filter portions 310b, various color filter portions 310c and various infrared band-pass filter 312, in which the color filter portions 310a, 310b and 310c are located respectively corresponding to the dual-waveband photosensitive devices 304a, 304c and 304d, and the infrared band-pass filter 312 are located corresponding to the infrared photosensitive devices 304b. In other words, the operation of forming the infrared band-pass filters 312 and the operation of forming the color filter portions 310a, 310b and 310c are performed to form the infrared band-pass filters 312 and the color filter portions 310a, 310b and 310c in the color filter layer 306. In some examples, the operation of forming the infrared band-pass filter 312 is performed to form the infrared band-pass filter 312 including a titanium film with a thickness smaller than 1000 Angstroms. In certain examples, the operation of forming the infrared band-pass filter 312 is performed to form the infrared band-pass filter 312 including a plasmonic structure, in which the plasmonic structure may be formed from metals.

In some exemplary examples, the operation of forming the color filter layer 306 includes forming the color filter portions 310a as red color filter portions, and the operation of forming the dual-waveband photosensitive devices 304a is performed to form the dual-waveband photosensitive devices 304a as red light and infrared light photosensitive devices for receiving the radiations filtered by the red color filter portions. The operation of forming the color filter layer 306 includes forming the color filter portions 310b as blue color filter portions, and the operation of forming the dual-waveband photosensitive devices 304c is performed to form the dual-waveband photosensitive devices 304c as blue light and infrared light photosensitive devices for receiving the radiations filtered by the blue color filter portions. The operation of forming the color filter layer 306 includes forming the color filter portions 310c as green color filter portions, and the operation of forming the dual-waveband photosensitive devices 304d is performed to form the dual-waveband photosensitive devices 304d as green light and infrared light photosensitive devices for receiving the radiations filtered by some of the green color filter portions. The infrared photosensitive devices 304b receive the radiations filtered by the infrared band-pass filter 312.

At operation 504, a micro-lens layer 308 is formed on the color filter portions 310a, 310b and 310c and the infrared band-pass filter 312 of the color filter layer 306. In some examples, the operation of forming the micro-lens layer 308 is performed to form the micro-lens layer 308 including various micro-lenses 314, in which locations and areas of the micro-lenses 314 are respectively corresponding to those of the color filter portions 310a, 310b and 310c and the infrared band-pass filters 312.

In various examples, as shown in FIG. 3A, before the operation of forming the color filter portions 310a, 310b and 310c and the infrared band-pass filter 312 of the color filter layer 306, an anti-reflective coating layer 316 is optionally formed on the substrate 302 to cover the dual-waveband photosensitive devices 304a, 304c and 304d and the infrared photosensitive devices 304b. With the formation of the anti-reflective coating layer 316, the amount of the radiation entering the dual-waveband photosensitive devices 304a, 304c and 304d and the infrared photosensitive devices 304b is increased.

Figure 6:
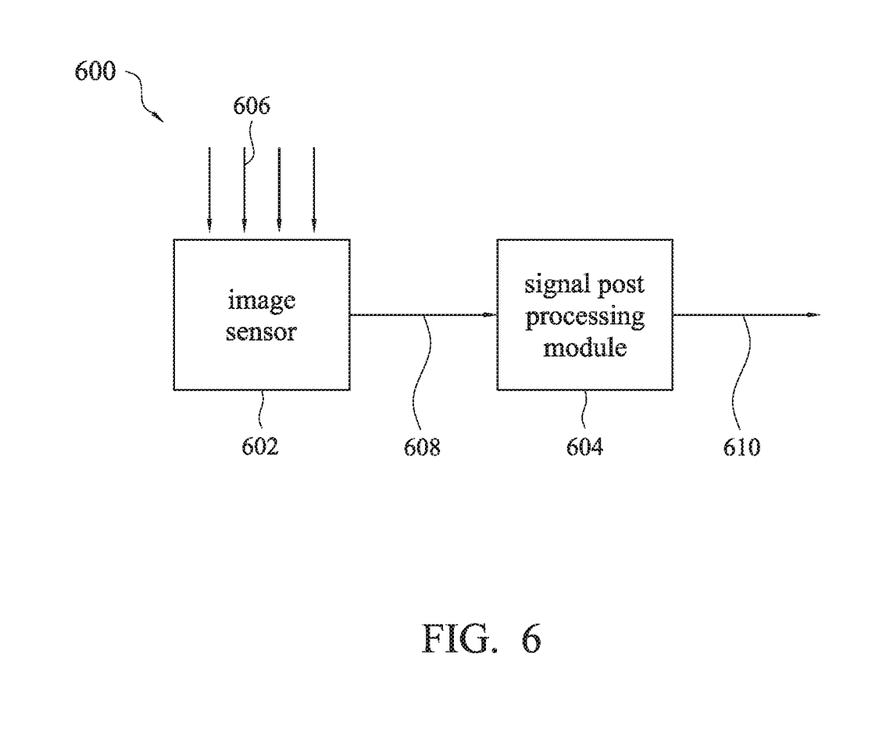
FIG. 6 is a schematic block diagram of an image processing system in accordance with some embodiments.

FIG. 6 is a schematic block diagram of an image processing system in accordance with some embodiments. As shown in FIG. 6, in some embodiments, an image processing system 600 includes an image sensor 602 and a signal post processing module 604. In some examples, the image sensor 602 may be the image sensor 200 or the image sensor 300 described above and respectively shown in FIG. 2A and FIG. 2B. Similar to the image sensor 200 or 300, the image sensor 602 is configured to sense an incident radiation 606 and then generate various electrical signals 608. In the embodiments, each of the electrical signals 608 includes an IR signal component. The image sensor 602 is electrically connected to the signal post processing module 604 and the electrical signals 608 can be transmitted to the signal post processing module 604.

After receiving the electrical signals from the image sensor 602, the signal post processing module 604 performs signal post processing on all the electrical signals 608 from all of the pixels of the image sensor 602, so as to remove the IR signal components from the electrical signals 608 by subtracting the IR signal components, thereby obtaining a pure visible light image 610 of the incident radiation 606.

With the combination of the image sensor 602 and the signal post processing module 604, an additional infrared filter element can be omitted, and a glass substrate holding the infrared filter element can be removed from an image module which includes the image sensor 602, so as to reduce the thickness of the image module.

In accordance with an embodiment, the present disclosure discloses an image sensor. The image sensor includes a substrate, dual-waveband photosensitive devices, at least one infrared photosensitive device, a transparent dielectric layer, at least one infrared band-pass filter, a color filter layer and a micro-lens layer. The dual-waveband photosensitive devices are disposed in the substrate, in which each of the dual-waveband photosensitive devices is configured to sense an infrared light and one visible light. The at least one infrared photosensitive device is disposed in the substrate, in which the dual-waveband photosensitive devices and the at least on infrared photosensitive device are arranged in an array. The transparent dielectric layer is disposed over the dual-waveband photosensitive devices and the at least one infrared photosensitive device. The at least one infrared band-pass filter is disposed in the transparent dielectric layer and corresponds to the at least one infrared photosensitive device. The color filter layer is disposed to cover the transparent dielectric layer and the at least one infrared band-pass filter. The micro-lens layer is disposed on the color filter layer.

In accordance with another embodiment, the present disclosure discloses an image sensor. The image sensor includes a substrate, dual-waveband photosensitive devices, at least one infrared photosensitive device, a color filter layer and a micro-lens layer. The dual-waveband photosensitive devices are disposed in the substrate, in which each of the dual-waveband photosensitive devices is configured to sense an infrared light and one visible light. The at least one infrared photosensitive device is disposed in the substrate, in which the dual-waveband photosensitive devices and the at least on infrared photosensitive device are arranged in an array. The color filter layer is disposed over the dual-waveband photosensitive devices and the at least on infrared photosensitive device. The color filter layer includes color filter portions respectively corresponding to the dual-waveband photosensitive devices and at least one infrared band-pass filter corresponding to the at least one infrared photosensitive device. The micro-lens layer is disposed on the color filter layer.

In accordance with yet another embodiment, the present disclosure discloses a method for manufacturing an image sensor. In this method, various dual-waveband photosensitive devices and at least one infrared photosensitive device are formed in a substrate, in which the dual-waveband photosensitive devices and the at least on infrared photosensitive device are arranged in an array, and each of the dual-waveband photosensitive devices is formed to sense an infrared light and one visible light. At least one infrared band-pass filter is formed above and corresponding to the at least one infrared photosensitive device. Various color filter portions are formed above the substrate and respectively corresponding to the dual-waveband photosensitive devices. A micro-lens layer is formed above the at least one infrared band-pass filter and the color filter portions.

In accordance with still another embodiment, the present disclosure discloses an image processing system. The image processing system includes an image sensor and a signal post processing module. The image sensor is configured to sense an incident radiation and generate electrical signals, in which each of the electrical signals includes an infrared signal component. The image sensor includes a substrate, dual-waveband photosensitive devices, at least one infrared photosensitive device, a transparent dielectric layer, at least one infrared band-pass filter, a color filter layer and a micro-lens layer. The dual-waveband photosensitive devices are disposed in the substrate, in which each of the dual-waveband photosensitive devices is configured to sense an infrared light and one visible light. The at least one infrared photosensitive device is disposed in the substrate, in which the dual-waveband photosensitive devices and the at least on infrared photosensitive device are arranged in an array. The transparent dielectric layer is disposed over the dual-waveband photosensitive devices and the at least one infrared photosensitive device. The at least one infrared band-pass filter is disposed in the transparent dielectric layer and corresponds to the at least one infrared photosensitive device. The color filter layer is disposed to cover the transparent dielectric layer and the at least one infrared band-pass filter. The micro-lens layer is disposed on the color filter layer. The signal post processing module is configured to receive the electrical signals from the image sensor and to remove the infrared signal components from the electrical signals to obtain a pure visible light image of the incident radiation.

In accordance with still yet another embodiment, the present disclosure discloses an image processing system. The image processing system includes an image sensor and a signal post processing module. The image sensor is configured to sense an incident radiation and generate electrical signals, in which each of the electrical signals includes an infrared signal component. The image sensor includes a substrate, dual-waveband photosensitive devices, at least one infrared photosensitive device, a color filter layer and a micro-lens layer. The dual-waveband photosensitive devices are disposed in the substrate, in which each of the dual-waveband photosensitive devices is configured to sense an infrared light and one visible light. The at least one infrared photosensitive device is disposed in the substrate, in which the dual-waveband photosensitive devices and the at least on infrared photosensitive device are arranged in an array. The color filter layer is disposed over the dual-waveband photosensitive devices and the at least on infrared photosensitive device. The color filter layer includes color filter portions respectively corresponding to the dual-waveband photosensitive devices and at least one infrared band-pass filter corresponding to the at least one infrared photosensitive device. The micro-lens layer is disposed on the color filter layer. The signal post processing module is configured to receive the electrical signals from the image sensor and to remove the infrared signal components from the electrical signals to obtain a pure visible light image of the incident radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a substrate;
   a plurality of dual-waveband photosensitive devices disposed in the substrate, wherein each of the dual-waveband photosensitive devices is configured to sense an infrared light and one visible light;
   at least one infrared photosensitive device disposed in the substrate, wherein the dual-waveband photosensitive devices and the at least one infrared photosensitive device are arranged in an array;
   a transparent dielectric layer disposed over the dual-waveband photosensitive devices and the at least one infrared photosensitive device;
   at least one infrared band-pass filter disposed in the transparent dielectric layer and corresponding to the at least one infrared photosensitive device;
   a color filter layer disposed on and covering the transparent dielectric layer and the at least one infrared band-pass filter; and
   a micro-lens layer disposed on the color filter layer.

2. The image sensor of claim 1, wherein the dual-waveband photosensitive devices comprise at least one red light and infrared light photosensitive device, at least one green light and infrared light photosensitive device, and at least one blue light and infrared light photosensitive device.

3. The image sensor of claim 2, wherein the color filter layer comprises:
   at least one red color filter portion corresponding to the at least one red light and infrared light photosensitive device;
   at least one green color filter portion corresponding to the at least one green light and infrared light photosensitive device; and
   at least one blue color filter portion corresponding to the at least one blue light and infrared light photosensitive device.

4. The image sensor of claim 3, wherein the color filter layer comprises at least two green color filter portions respectively corresponding to the at least one green light and infrared light photosensitive device and the at least one infrared photosensitive device.

5. The image sensor of claim 1, wherein the at least one infrared band-pass filter comprises a titanium film with a thickness smaller than 1000 Angstroms.

6. The image sensor of claim 1, wherein the at least one infrared band-pass filter comprises a plasmonic structure.

7. The image sensor of claim 1, further comprising an anti-reflective coating layer disposed between the substrate and the transparent dielectric layer.

8. An image sensor, comprising:
   a substrate;
   a plurality of dual-waveband photosensitive devices disposed in the substrate, wherein each of the dual-waveband photosensitive devices is configured to sense an infrared light and one visible light;
   at least one infrared photosensitive device disposed in the substrate, wherein the dual-waveband photosensitive devices and the at least one infrared photosensitive device are arranged in an array;
   at least one infrared band-pass filter disposed over and corresponding to the at least one infrared photosensitive device;
   a color filter layer disposed over the dual-waveband photosensitive devices and the at least one infrared band-pass filter, wherein the color filter layer comprises a plurality of color filter portions respectively corresponding to the dual-waveband photosensitive devices and the at least one infrared band-pass filter; and
   a micro-lens layer disposed on the color filter layer.

9. The image sensor of claim 8, wherein the dual-waveband photosensitive devices comprises at least one red light and infrared light photosensitive device, at least one green light and infrared light photosensitive device, and at least one blue light and infrared light photosensitive device.

10. The image sensor of claim 9, wherein the color filter portions comprises:
    at least one red color filter portion corresponding to the at least one red light and infrared light photosensitive device;
    at least two green color filter portions corresponding to the at least one green light and infrared light photosensitive device and the at least one infrared photosensitive device; and
    at least one blue color filter portion corresponding to the at least one blue light and infrared light photosensitive device.

11. The image sensor of claim 8, wherein the at least one infrared band-pass filter comprises a titanium film with a thickness smaller than 1000 Angstroms.

12. The image sensor of claim 8, wherein the at least one infrared band-pass filter comprises a plasmonic structure.

13. The image sensor of claim 8, further comprising an anti-reflective coating layer disposed between the substrate and the at least one infrared band-pass filter.

14. A method for manufacturing an image sensor, the method comprising:
    forming a plurality of dual-waveband photosensitive devices and at least one infrared photosensitive device in a substrate, wherein the dual-waveband photosensitive devices and the at least one infrared photosensitive device are arranged in an array, and each of the dual-waveband photosensitive devices is formed to sense an infrared light and one visible light;
    forming at least one infrared band-pass filter above and corresponding to the at least one infrared photosensitive device;
    forming a plurality of color filter portions above the substrate and the at least one infrared band-pass filter, wherein the color filter portions respectively correspond to the dual-waveband photosensitive devices and the at least one infrared band-pass filter; and
    forming a micro-lens layer above the at least one infrared band-pass filter and the color filter portions.

15. The method of claim 14, further comprising forming a transparent dielectric layer over the substrate before forming the at least one infrared band-pass filter, wherein forming the at least one infrared band-pass filter is performed to form the at least one infrared band-pass filter that is inserted through the transparent dielectric layer.

16. The method of claim 15, wherein
    forming the dual-waveband photosensitive devices is performed to form the dual-waveband photosensitive devices comprising at least one red light and infrared light photosensitive device, at least one green light and infrared light photosensitive device, and at least one blue light and infrared light photosensitive device; and
    forming the color filter portions comprises:
       forming at least one red color filter portion corresponding to the at least one red light and infrared light photosensitive device;
       forming at least two green color filter portion respectively corresponding to the at least one green light and infrared light photosensitive device and the at least one infrared band-pass filter; and forming at least one blue color filter portion corresponding to the at least one blue light and infrared light photosensitive device.

17. The method of claim 15, wherein forming the color filter portions comprises forming the color filter portions on and covering the transparent dielectric layer and the at least one infrared band-pass filter.

18. The method of claim 14, wherein forming the at least one infrared band-pass filter comprises forming the at least one infrared band-pass filter comprising a titanium film with a thickness smaller than 1000 Angstroms.

19. The method of claim 14, wherein forming the at least one infrared band-pass filter comprises forming the at least one infrared band-pass filter comprising a plasmonic structure.

20. The method of claim 14, further comprising forming an anti-reflective coating layer over the substrate before forming the at least one infrared band-pass filter, wherein forming the at least one infrared band-pass filter forms the at least one infrared band-pass filter over the anti-reflective coating layer.

* * * * *